United States Patent [19]
Hsu et al.

[11] Patent Number: 5,661,082
[45] Date of Patent: Aug. 26, 1997

[54] PROCESS FOR FORMING A SEMICONDUCTOR DEVICE HAVING A BOND PAD

[75] Inventors: Ting-Chen Hsu; Edward O. Travis; Clifford M. Howard, all of Austin; Stephen G. Jamison, Buda, all of Tex.

[73] Assignee: Motorola, Inc., Schaumburg, Ill.

[21] Appl. No.: 376,208

[22] Filed: Jan. 20, 1995

[51] Int. Cl.$^6$ .................................................. H01L 21/44
[52] U.S. Cl. ........................... 438/612; 438/666; 438/958
[58] Field of Search .................................... 437/190, 195, 437/203, 209, 211, 214, 217, 219, 220; 257/773, 774, 784

[56] References Cited

U.S. PATENT DOCUMENTS

| | | | |
|---|---|---|---|
| 4,355,456 | 10/1982 | Harnagel et al. | 437/190 |
| 4,916,519 | 4/1990 | Ward | 357/70 |
| 4,933,305 | 6/1990 | Kikkawa | 437/211 |
| 4,948,754 | 8/1990 | Kondo et al. | 437/190 |
| 4,949,150 | 8/1990 | Giannella | 357/46 |
| 4,993,618 | 2/1991 | Toyozawa et al. | 228/102 |
| 5,009,721 | 4/1991 | Matsumoto et al. | 257/773 |
| 5,082,801 | 1/1992 | Nagata | 437/190 |
| 5,226,582 | 7/1993 | Kubota et al. | 228/179 |
| 5,235,212 | 8/1993 | Shimizu et al. | 257/780 |
| 5,319,224 | 6/1994 | Sakashita et al. | 437/209 |
| 5,441,917 | 8/1995 | Rostoker et al. | 437/220 |
| 5,502,337 | 3/1996 | Nozaki | 257/774 |

*Primary Examiner*—Kevin Picardat
*Attorney, Agent, or Firm*—George R. Meyer

[57] ABSTRACT

Bond pads (394, 106) and bond pad openings (62, 108) are formed such that the bond pad openings (62, 108) are asymmetric to the conductive sections (398, 106) of the bond pads (394, 106). If the bond pads are more likely to lift from the scribe line side of the bond pad (394, 106), the bond pad openings (62, 108) are formed such that the passivation layer (52) overlies more of the conductive section (398, 106) near the scribe line (40). If the bond pads (394, 106) are more likely to lift from the other side, the passivation layer (52) overlies more of the other side of the conductive section (398, 106). In addition to reducing the risk of lifting, contamination problems should also be reduced.

16 Claims, 6 Drawing Sheets

PROCESS FOR FORMING A SEMICONDUCTOR DEVICE HAVING A BOND PAD

FIELD OF THE INVENTION

The present invention relates to semiconductor devices, and in particular, to devices having bond pads.

BACKGROUND OF THE INVENTION

Integrated circuits have increasing component densities as new generations of products are developed. The increased component density is generally achieved by reducing the size of the components within the integrated circuit. Typically, contact openings and other portions of the device are shrunk making some metal interconnections difficult to be formed. In doing so, interconnecting layers generally require a barrier that typically includes a refractory metal, refractory metal silicide, or refractory metal nitride. Compared to aluminum, these refractory metal materials typically are harder meaning that they are not elastic and do not easily bend.

Figure 1:
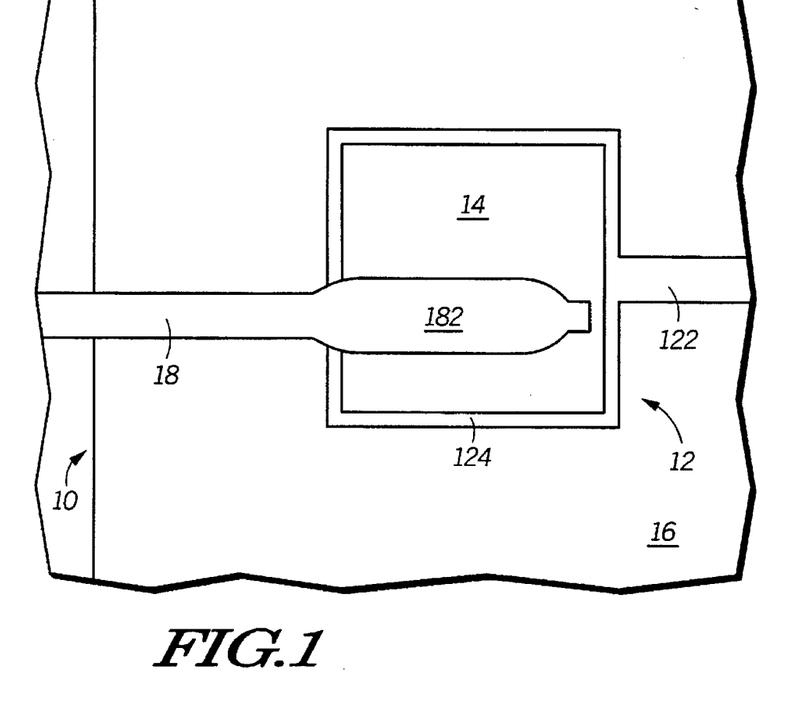
FIG. 1 includes an illustration of a plan view of a bond pad structure.

FIG. 1 includes a plan view of a bond pad structure. The structure includes a scribe line 10, a conductive member 12 that includes an interconnect 122 and a bond pad 124. Overlying the interconnect 122 and a portion of the bond pad 124 is a passivation layer 16. The passivation layer is patterned such that it ends at the scribe line. The passivation layer also includes an opening 14 that exposes almost all of the bond pad 124. A wire 18 is bonded to the bond pad 124 at the bond pad opening 14. When bonding is performed, a foot 182 is formed within the wire 18.

Figure 2:
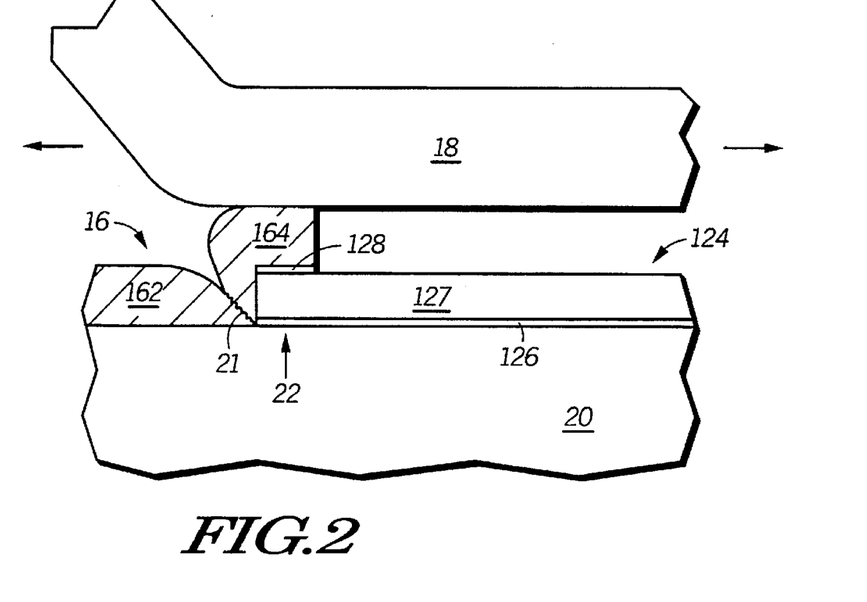
FIG. 2 includes an illustration of a cross-sectional view of a portion of the bond pad structure of FIG. 1 during a wire bonding operation.

FIG. 2 includes a cross-sectional view of the structure to illustrate problems that can arise during the wire bonding operation. The passivation layer 16 includes portions 162 and 164. Portion 162 lies along the surface of a substrate 20, and portion 164 lies over and along side the bond pad 124. Substrate 20 typically includes an insulating layer that contacts barrier layer 126. The bond pad 124 in this particular embodiment includes the barrier layer 126, a metallic layer 127, and an antireflective coating 128. The barrier layer 126 may also include an adhesion layer immediately adjacent to the surface of the substrate 20.

During one type of the wire bonding operation, the wire is moved laterally as indicated by the arrows in FIG. 2 to remove any native oxide that lies on layer 127 prior to wire bonding operation. This abrasion portion of the wire bonding step causes fractures to form in the passivation layer between portions 162 and 164. A fracture 21 is formed at a point in the passivation layer 16 where portions 162 and 164 meet. In some instances, portion 164 is completely ripped off the bond pad.

After the bond is formed, the bond pad 124 can lift because fracture 21 is formed. The lifting force typically occurs when the wire 18 reels out of a bonder after the wire 18 is bonded to the bond pad 124 and before bonding the wire to a post of a lead frame (not illustrated in FIGS. 1 and 2) or during a bond pull test. The lifting force can cause the fracture 21 to propagate along interface 22 or within barrier layer 126. If this occurs, the bond pad 124 is lifted at least partially away from the substrate 20. If there is an adhesion layer between the substrate 20 and the barrier layer 126, the separation occurs on either side or through an adhesion layer. The lifting phenomenon occurs because the barrier layer 126 is harder than the metallic layer 127. The integrated circuit is nonfunctional if the bond pad is lifted partly or completely away from the device.

After fracture 21 is formed, contaminants including water, hydrogen, mobile ions, or the like migrate between the passivation portion 162 and bond pad 124 and into the substrate 20. Bond pad lifting and contamination cause reliability problems and cannot be tolerated with semiconductor devices.

BRIEF DESCRIPTION OF THE DRAWINGS

The present invention is illustrated by way of example and not limitation in the figures, in which like references indicate similar elements, and in which:

FIGS. 3-A to 3-C. include illustrations of a semiconductor device including scribe lines, bond pads, and bond pad openings;

DETAILED DESCRIPTION

Within a semiconductor device, bond pad openings are formed that are asymmetric to conductive sections of bond pads. Unlike conventional devices that have symmetry between the bond pads and bond pad openings, the asymmetry compensates for lifting forces during or after wire bonding between a semiconductor device and a lead frame of a semiconductor package. If more lifting force is near a scribe line of the semiconductor device, more of the bond pad near the scribe line is covered by the passivation layer. If more lifting force is near the other side of the bond pad, more of the bond pad near the other side is covered by the passivation layer. The present invention is better understood by the embodiments that are described below.

Bond Pad Formation

Figure 3:
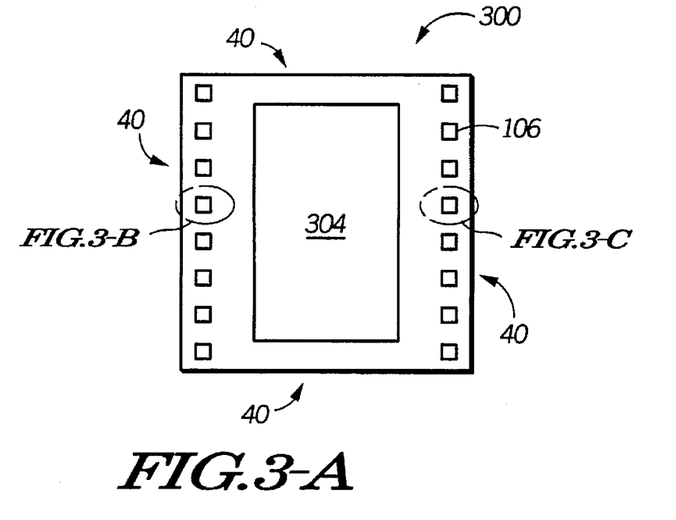

FIGS. 3-A to 3-C illustrate a semiconductor device 300 with a component portion 304 that includes transistors, resistors, capacitors, or the like. Scribe lines 40 lie along the edges of the semiconductor device 300 and the bond pads 106 lie near the scribe lines 40. Interconnects 104 electrically connect the bond pads 106 to components within the component portion 304. In this particular embodiment, more lifting force occurs near the scribe line sides of the bond pads 106. Therefore, the bond pad openings 62 are formed further from the scribe lines 40. Processes for forming semiconductor devices with the asymmetric bond pad openings is described in more detail below.

Figure 4:
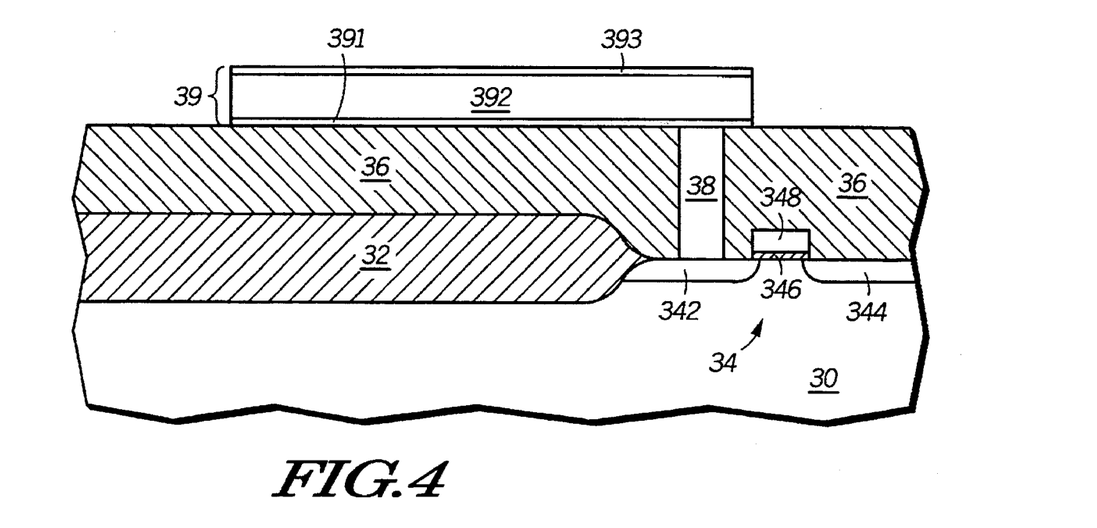
FIG. 4 includes an illustration of a cross-sectional view a portion of a semiconductor substrate including a transistor and a conductive member.

The components within the component section are formed during the early processing steps of the process sequence. Referring to FIG. 4, a field isolation region 32 and a transistor 34 are formed over a semiconductor substrate 30. The transistor 34 is a component within the component section of the device. The component section includes other transistors, resistors, capacitors, or the like but are not shown in FIG. 4. The transistor 34 includes a source region 344, a drain region 342, a gate dielectric layer 346, and a gate electrode 348. An insulating layer 36 is formed over the field isolation region 32 and the transistor 34 and includes undoped oxide, phosphosilicate glass (PSG), borophosphosilicate glass (BPSG), or the like.

A contact opening is formed through the insulating layer 36 and a contact plug 38 is formed within that contact opening. Although not illustrated, contact plug 38 typically includes an adhesion layer, a barrier layer, and a plug fill layer. Many different materials can be used for the three layers. In one particular embodiment, the adhesion layer includes titanium, the barrier layer includes titanium nitride, and the plug fill layer includes tungsten.

A conductive layer is formed over the contact plug 38 and is patterned. The conductive member 39 includes a lower layer 391, a metallic layer 392, and an antireflective coating 393. The layers 391–393 are typically formed by chemical vapor deposition or sputter deposition. The lower layer 391 includes an adhesion layer and a barrier layer. With respect to materials, the lower layer 391 has a refractory metal, refractory metal silicide, or a refractory metal nitride. The presence of the refractory metal materials within the lower layer 391 is believed to be a significant factor with respect to bond pad lifting because they are hard and less likely to bend and are more likely to crack or fracture.

The metallic layer 392 includes aluminum, copper, and the like, and the antireflective coating 393 includes titanium nitride, silicon nitride, or the like. In this particular embodiment, the lower layer 391 includes a titanium adhesion layer and a titanium nitride barrier layer. The metallic layer 392 includes aluminum, and the antireflective coating 393 includes titanium nitride.

Figure 5:
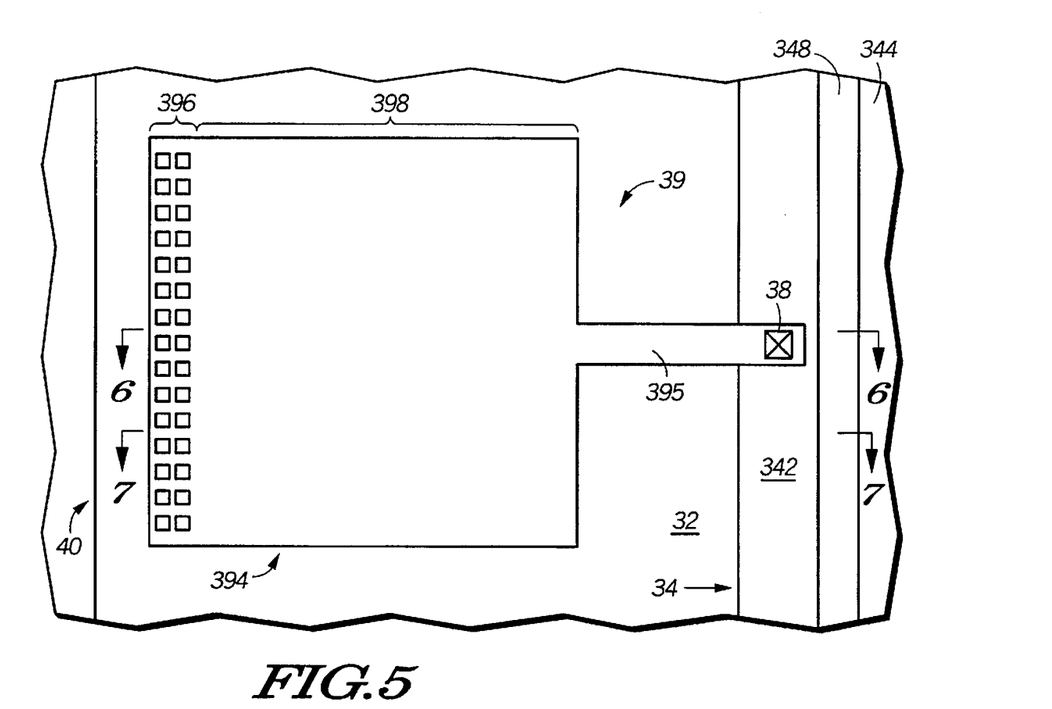
FIG. 5 includes an illustration of a plan view of the substrate of FIG. 4 illustrating a bond pad and an interconnect.

FIG. 5 includes a plan view of a portion of the device at this point in processing. For simplicity, insulating layer 36 is not illustrated within any of the plan views of this specification. The source region 344, drain region 342, and gate electrode 348 are near the right side of FIG. 5. The conductive member 39 includes an interconnect 395 and a bond pad 394. The contact plug 38 is shown as an "X" within a square.

The scribe line 40 is illustrated near the left side of FIG. 5. The bond pad 394 has an input protection section 396 that includes diodes and a conductive section 398, which is that part of the bond pad 394 that is not part of the input protection section 396. If there is no input protection section 396, the bond pad and the conductive section are the same. In FIGS. 3-A to 3-C, the bond pad 106 is also the conductive section because there is no input protection section.

Figure 6:
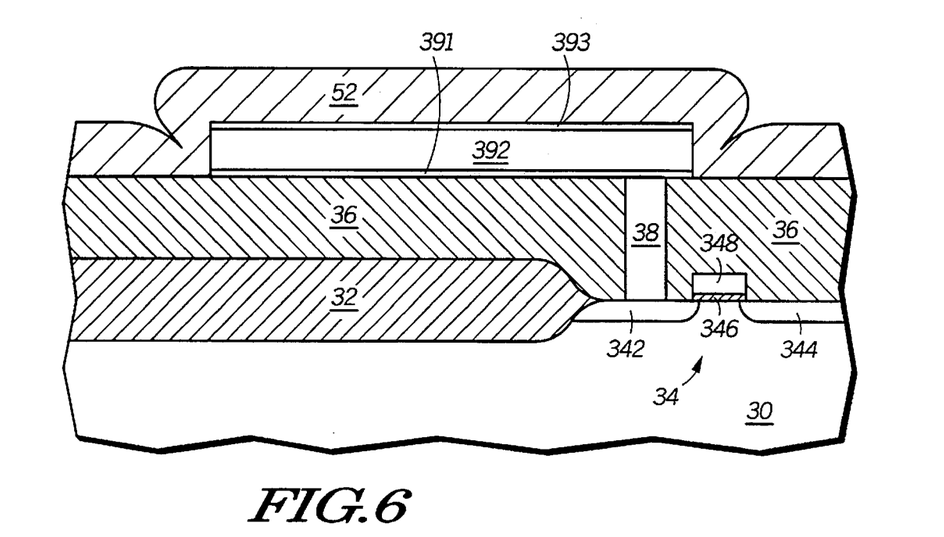
FIG. 6 includes an illustration of a cross-sectional view of the substrate of FIG. 5 after forming a passivation layer.

A passivation layer 52 is formed over the insulating layer 36 and the antireflective coating 393, as shown in FIG. 6. The passivation layer includes at least one material, such as nitride, oxide, oxynitride, or the like. The passivation is typically formed by chemical vapor deposition at a temperature in a range of 270–420 degrees Celsius and usually no higher than 450 degrees Celsius. In one specific embodiment, the passivation layer 52 includes a layer of PSG and a layer of plasma-enhanced nitride.

Figure 7:
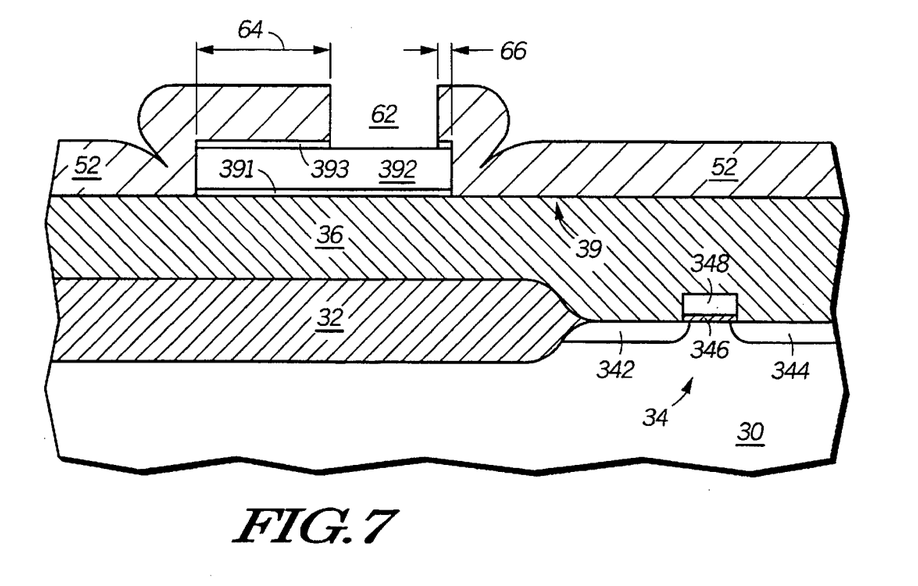
FIG. 7 includes an illustration of a cross-sectional view of the substrate of FIG. 6 after forming a bond pad opening.

A bond pad opening 62 is formed by etching though a portion of passivation layer 52 as shown in FIG. 7. The etch also removes a portion of the antireflective coating 393 to expose a portion of the metallic layer 392 that underlies the bond pad opening 62. As seen in FIG. 7, the bond pad opening 62 is not centered over the layers 391–393. The bond pad opening 62 is offset towards the transistor 34.

Figure 8:
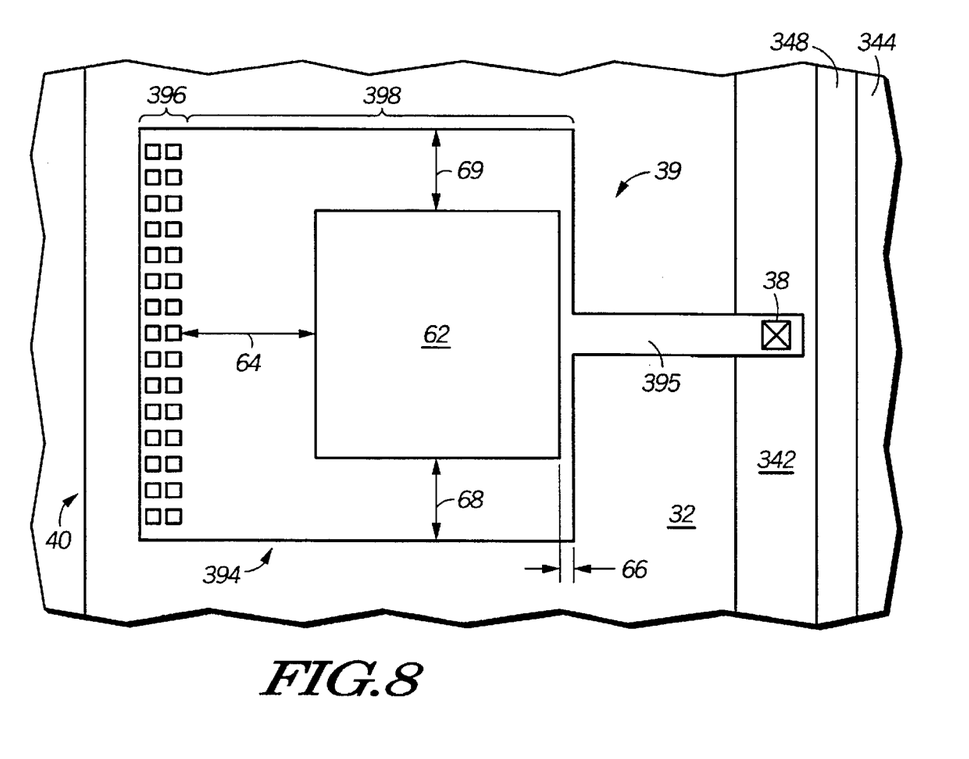
FIG. 8 includes an illustration of a plan view of the substrate of FIG. 7 illustrating the location of the bond pad opening.

FIG. 8 is an illustration of a plan view of the device at this point in processing. The passivation layer 52 overlies all of the device to the right of the scribe line 40 other than the opening 62. The passivation layer 52 is not identified within FIG. 8 so the positional relationships between various elements of the device are more easily seen.

Portions 64, 66, 68, and 69 are portions of the conductive section 398 of the bond pad 394 that are covered by the passivation layer 52 and are illustrated by arrows in FIG. 8. Scribe line portion 64 lies closest to scribe line 40, and component portion 66 lies furthest from the scribe line 40. Lateral portions 68 and 69 lie adjacent to portions 64 and 66 and adjacent to opposite sides of the bond pad opening 62.

In one specific embodiment, the bond pad opening 62 is about 90 microns by 90 microns (3.5 mils by 3.5 mils). The width of the scribe line portion 64 has a width of about 30 microns (1.2 mils), component portion 66 has a width of about 3 microns (0.1 mils), and the lateral portions 68 and 69 have widths of about 10 microns (0.4 mils). The scribe line portion 64 is the widest portion, and the component portion 66 is the narrowest portion. Usually, the scribe line portion 64 is in a range of 2–20 times wider than the component portion 66. The lateral portions 68 and 69 are in a range of 1.5–10.0 times wider than the component portion 66. Although portions 68 and 69 are illustrated to be the same width, portion 68 and 69 can have different widths. However, portions 68 and 69 have widths are between the widths of the portions 64 and 66.

Figure 9:
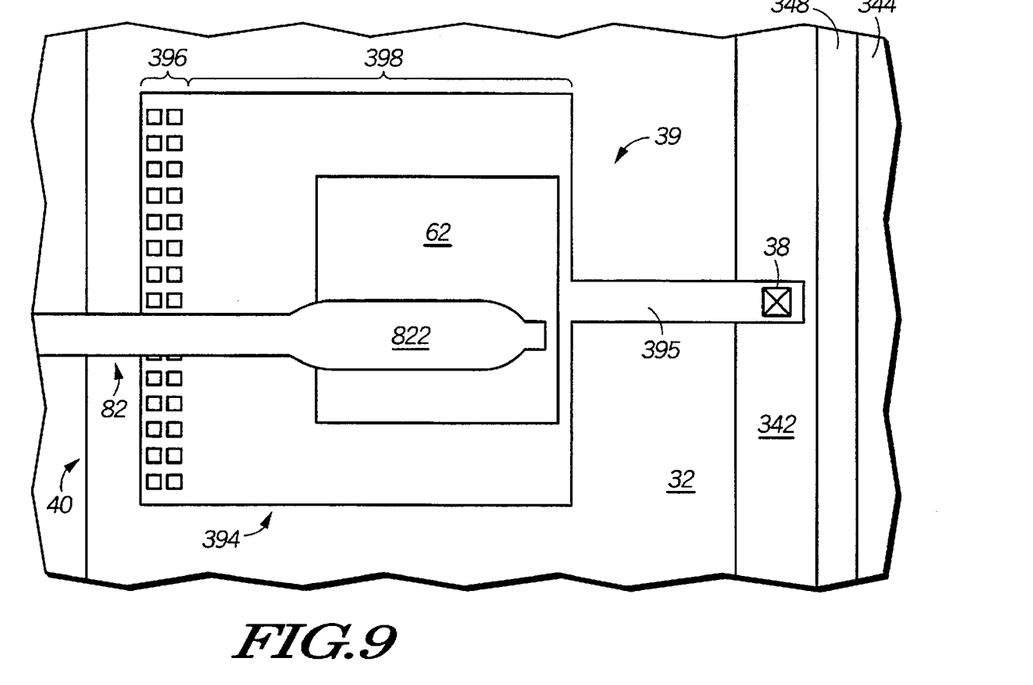
FIG. 9 includes an illustration of a plan view of the substrate of FIG. 8 after forming a wire bond to the bond pad.
Figure 10:
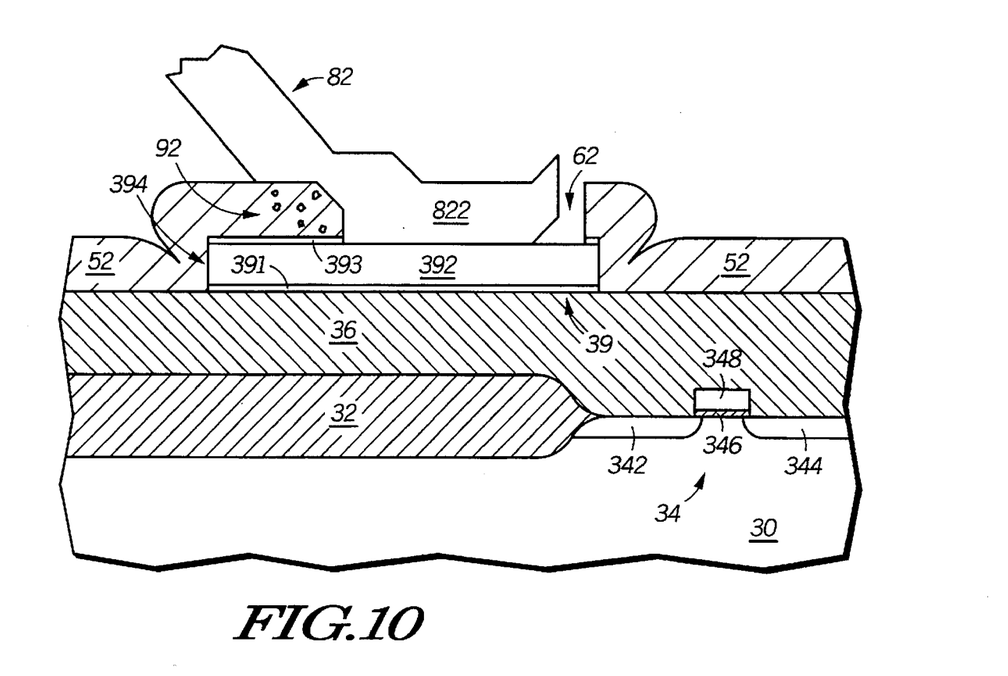
FIG. 10 includes an illustration of a cross-sectional view of the wire within the bond pad opening.

After forming the bond pad opening 62, a wire 82 is bonded to the conductive section 398 of the bond pad 394 as shown in FIG. 9. The portion of the bond pad that is bonded to the device forms a foot 822. FIG. 10 includes a cross-sectional view of the device at this point in the process. The wire 82 is bonded directly to the metallic layer 392.

In this embodiment, an abrasion type of bonding called "aluminum wedge" is used. During the bonding step, a small chunk of the passivation layer 52 is removed and some fractures 92 are formed as illustrated in FIG. 10. This damage typically occurs when the wire or the bonder contacts with the passivation layer 52 during a wire bonding step. Note that the fractures 92 are formed over the bond pad 394 instead of along its side. Therefore, fractures 92 are less likely to propagate along the interface between layers 36 and 391 because the fractures are not formed near the side of the bond pad 394. The chances of bond pad lifting during or after the bonding step are reduced.

FIGS. 4–10 illustrates the formation of one of the bond pads. The other bond pads in the device are similar. Referring to FIGS. 3-A to 3-C, the bond pad layout on opposite sides of the device are mirror images of each other. The scribe line portions of the bond pads 106 covered by the passivation layer are wider than the component portions of the bond pads 106.

Figure 11:
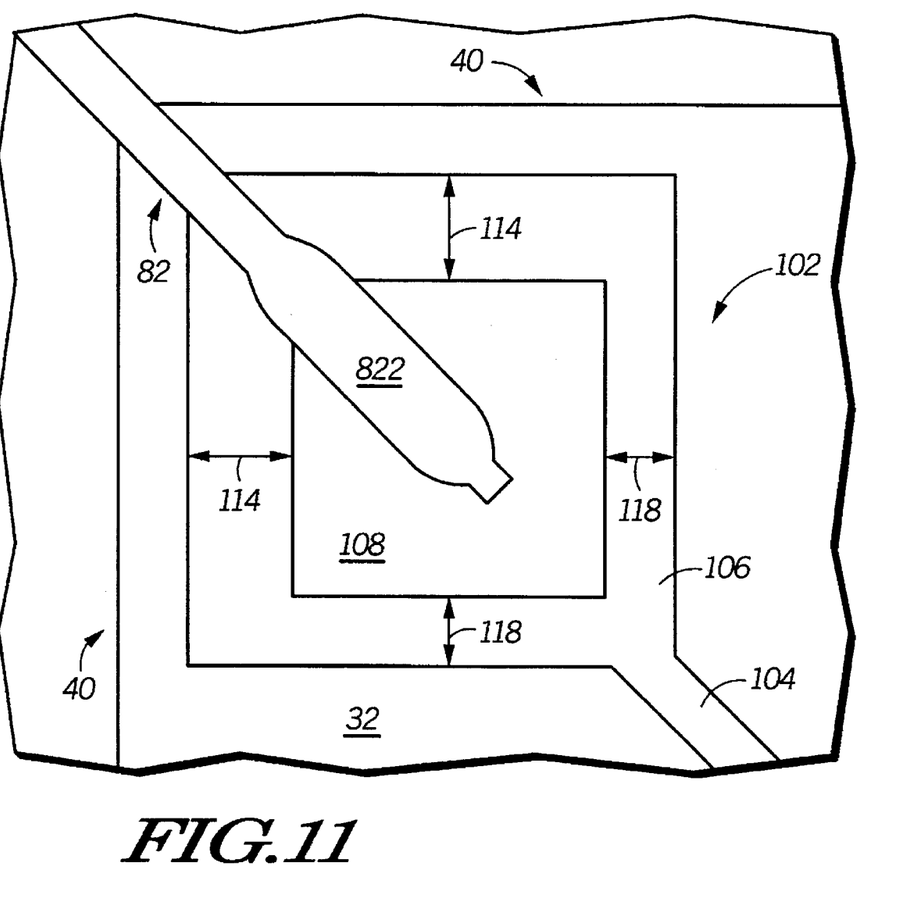
FIG. 11 includes an illustration of a plan view of a bond pad structure near an intersection of two scribe lines.

In an alternate embodiment, a bond pad is formed near more than one scribe line 40 as shown in FIG. 11. In this particular embodiment, there is a conductive member 102 that includes the bond pad 106 and interconnect 104. The bond pad 106 does not include an input protection section, and therefore, the bond pad 106 and the conductive section are the same.

A passivation layer is formed over the conductive member 102 and then patterned to form a bond pad opening 108 as shown in FIG. 11. Similar to FIG. 8, the passivation layer covers all of the device except for the scribe lines 40 and the bond pad opening 108. The bond pad 106 has four portions that are covered by the passivation layer. Scribe line portions 114 are adjacent to the scribe lines 40, and each of the lateral portions 118 are adjacent to one of the scribe line portions 114. In this particular embodiment, each of the scribe line portions 114 has a width of about 30 microns (1.25 mils), and each of lateral portions 118 has a width of about 10 microns (0.4 mils). Each of the portions 114 is typically in a range of 1.5–20.0 times wider than each of the portions 118. The bonding wire 82 and its foot 822 are formed such that they are oriented essentially diagonally across to the bond pad 106.

In another embodiment that is not shown, a bond pad is generally oval shaped, the bond pad opening is generally circular opening. The circular bond pad opening would be offset similar to the previous embodiments. Other combinations of square, rectangular, oval, and circular shapes of bond pads and bond pad openings are possible. Other geometric shapes could also be used.

In still other embodiments, other bonding methods are used. For example, gold ball bonding is used but is more likely to cause lifting from the component side of the bond pad 394 instead of the scribe line side. In this embodiment, the widths of the scribe line portions 64 and component portions are reversed compared to the previous embodiment. The wire and the wire bonding method used to form the wire for the semiconductor device can be one of several including those that use an abrasion type method that rubs the wire against the bond pad itself.

In further embodiments, the bond pads is located along a center strip of the device. These devices are still susceptible to lifting problems that are directed towards or away from the lead frame of the package. Asymmetric bond pad openings can be used with these types of packages.

Benefits

The embodiments of the present invention allow bond pads and wires to those bond pads to be formed with a reduced risk of bond pad lifting or contamination issues arising. The bond pad is formed such that the passivation layer overlies more of the bond pad near the side of the bond pad that is most likely to lift. More specifically, the passivation layer is large enough so that fractures or other damage within the passivation layer do not cause a fracture to propagate along an interface between a refractory metal containing layer and an insulating layer. Also, the passivation layer at the side of the bond pad is less likely to be removed. If the side of the bond pad closer to the scribe line is more likely to lift, the passivation layer overlies more of the bond pad near the scribe line If the side of the bond pad closer to the components is more likely to lift, the passivation layer overlies more of the bond pad near the components.

Contamination problems are reduced because the passivation layer is not fractured or removed along the side of the bond pad. Reliability problems that are related to water, hydrogen, and mobile ion contamination should be reduced.

Implementation of the present invention is relatively simple. The mask used to form the bond pads, the bond pad openings, or both are adjusted to allow the bond pads with the offset bond pad openings. In one embodiment, the bond pads are made larger and the bond pad openings remain the same size. Additional processing steps including masking steps are not needed. Further, exotic materials, such as a "super glue" adhesion layer, or marginal processing steps do not have to be used or developed. The present invention is easily integrated into an existing process flow.

In the foregoing specification, the invention has been described with reference to specific embodiments thereof. However, it will be evident that various modifications and changes can be made thereto without departing from the scope of the invention as set forth in the appended claims. Accordingly, the specification and figures are to be regarded in an illustrative rather than a restrictive sense.

We claim:

1. A process for forming a semiconductor device comprising the steps of:
   forming a first bond pad, a first interconnect, a second bond pad, and a second interconnect over a substrate, wherein:
      the first bond pad includes a first conductive section that lies adjacent to the first interconnect; and
      the second bond pad includes a second conductive section that lies adjacent to the second interconnect;
   forming a passivation layer over the first and second bond pads; and
   forming a first bond pad opening and a second bond pad opening through the passivation layer, wherein:
      the first bond pad opening overlies the first bond pad;
      the second bond pad opening overlies the second bond pad;
      the passivation layer overlies first and second portions of the first and second conductive sections;
      the second portion of the first conductive section lies adjacent to the first interconnect;
      the first portion of the first conductive section lies further from the first interconnect compared to the second portion of the first conductive section;
      the second portion of the second conductive section lies adjacent to the second interconnect;
      the first portion of the second conductive section lies further from the second interconnect compared to the second portion of the second conductive section;
      the first bond pad lies closer to a first side of the semiconductor device compared to the second bond pad;
      the second bond pad lies closer to a second side of the semiconductor device that is opposite the first side compared to the first bond pad; and
      each of the first portions is wider than each of the second portions.

2. The process of claim 1, wherein the step of forming the passivation layer is performed by depositing an insulating layer at a temperature no higher than 450 degrees Celsius.

3. The process of claim 1, wherein the step of forming the first bond pad, the first interconnect, the second bond, and the second interconnect includes a step of forming a layer including a material selected from a group consisting of a refractory metal, a refractory metal silicide, and a refractory metal nitride.

4. The process of claim 1, wherein the first portion of the first conductive section is in a range of 2–20 times wider than the second portion of the first conductive section.

5. The process of claim 1, wherein:
   the step of forming the first bond pad, the first interconnect, the second bond pad, and the second interconnect includes steps of depositing a metal-containing layer and depositing an antireflective coating;

the step of forming the passivation layer is performed such that the passivation layer is formed over the antireflective coating; and the step of forming the first and second bond pad openings is performed such that portions of the antireflective coating are removed thereby exposing the metal-containing layer.

6. The process of claim 1, further comprising a step of bonding wires to the first and second conductive sections by using a bonder, wherein the wire or bonder contacts the passivation layer during the step of bonding.

7. A process for forming a semiconductor device comprising the steps of:

forming a first bond pad and a second bond pad over a substrate, wherein:

the first bond pad includes a first conductive section and lies closer to a first scribe line compared to the second bond pad; and the second bond pad includes a second conductive section and lies closer to a second scribe line;

forming a passivation layer over the first and second bond pads; and forming a first bond pad opening and a second bond pad opening through the passivation layer, wherein:

the first bond pad opening overlies the first bond pad;

the second bond pad opening overlies the second bond pad;

the passivation layer overlies first portions, second portions, third portions, and fourth portions of the first and second conductive sections;

for the first conductive section:

the first and second portions lie adjacent to opposite sides of the first bond pad opening; and the third and fourth portions lie adjacent to opposite sides of the first bond pad opening and adjacent to the first and second portions;

for the second conductive section:

the first and second portions lie adjacent to opposite sides of the first bond pad opening; and the third and fourth portions lie adjacent to opposite sides of the second bond pad opening and adjacent to the first and second portions; and the first portions are widest, the second portions are narrowest, and the third and fourth portions have widths that are between widths of the first and second portions.

8. The process of claim 7, wherein:

the passivation layer is formed by depositing an insulating layer at a temperature no higher than 450 degrees Celsius; and the insulating layer includes a material selected from a group consisting of nitride, oxide, and oxynitride.

9. The process of claim 7, wherein the step of forming the first and second bond pad openings is performed such that each of the first portions is in a range of 2–20 times wider than each of the second portions.

10. The process of claim 7, wherein:

the step of forming the first and second bond pads includes steps of:

depositing a layer including a material selected from a group consisting of a refractory metal, a refractory metal silicide, and a refractory metal nitride;

depositing a metal-containing layer; and depositing an antireflective coating;

the step of forming the passivation layer is performed such that the passivation layer overlies the antireflective coating; and the step of forming the first and second bond pad openings is performed such that portions of the antireflective coating are removed thereby exposing the metal-containing layer.

11. The process of claim 7, further comprising a step of bonding wires to the first and second conductive sections by using a bonder, wherein the wire or bonder contacts the passivation layer during the step of bonding.

12. A process for forming a semiconductor device comprising:

forming a bond pad and an interconnect over a semiconductor substrate, wherein the bond pad has a conductive section;

forming a passivation layer over the bond pad and the interconnect;

forming a bond pad opening through the passivation layer, wherein:

the bond pad opening overlies the bond pad;

the passivation layer overlies a first portion and a second portion of the conductive section;

the second portion of the conductive section lies adjacent to the interconnect;

the first portion of the conductive section lies further from the interconnect compared to the second portion; and the first portion is wider than the second portion; and bonding a wire to the bond pad.

13. The process of claim 12, wherein the step of forming the bond pad and the interconnect is performed such that the bond pad has a layer that includes a material selected from a group consisting of a refractory metal, a refractory metal silicide, and a refractory metal nitride.

14. The process of claim 12, wherein the step of forming the bond pad opening is performed such that passivation layer overlies another first portion and another second portion of the conductive section, wherein each of the first portions are wider than each of the second portions.

15. The process of claim 12, wherein the step of forming the passivation layer is performed such that the first portion of the conductive section is in a range of 2–20 times wider than the second portion of the conductive section.

16. The process of claim 12, wherein the step of forming the passivation layer is performed such that:

the passivation layer overlies a third portion of the conductive section;

the third portion lies adjacent to the bond pad opening, the first portion, and the second portion; and the third portion is narrower than the first portion and wider than the second portion.

* * * * *